United States Patent
Pan (10) Patent No.: US 12,074,176 B2
(45) Date of Patent: Aug. 27, 2024

(54) SUBSTRATE PROCESSING METHOD

(71) Applicants: HKC CORPORATION LIMITED, Shenzhen (CN); CHONGQING HKC OPTOELECTRONICS TECHNOLOGY CO., LTD., Chongqing (CN)

(72) Inventor: Posung Pan, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 999 days.

(21) Appl. No.: 17/036,964

(22) Filed: Sep. 29, 2020

(65) Prior Publication Data
US 2021/0028199 A1 Jan. 28, 2021

Related U.S. Application Data

(63) Continuation of application No. PCT/CN2018/105057, filed on Sep. 11, 2018.

(30) Foreign Application Priority Data

Jul. 17, 2018 (CN) .......................... 201810784557.7

(51) Int. Cl.
*H01L 27/12* (2006.01)
*C03C 15/00* (2006.01)
*G06Q 10/0639* (2023.01)
*G06Q 30/018* (2023.01)
*G06Q 50/04* (2012.01)
*G07C 3/00* (2006.01)

(52) U.S. Cl.
CPC .......... *H01L 27/1262* (2013.01); *C03C 15/00* (2013.01); *G06Q 10/06395* (2013.01);
(Continued)

(58) Field of Classification Search
None
See application file for complete search history.

(56) References Cited

U.S. PATENT DOCUMENTS 6,889,110 B1 * 5/2005 Jain .................. G05B 19/41865
700/121
7,254,457 B1 * 8/2007 Chen ...................... G06Q 50/04
700/121
(Continued)

FOREIGN PATENT DOCUMENTS

CN 101192049 A 6/2008
CN 104425300 A 3/2015
(Continued)

OTHER PUBLICATIONS

First Office Action in counterpart Chinese Application No. 201810784557.7, dated Mar. 26, 2020.
(Continued)

*Primary Examiner* — Lina Cordero
(74) *Attorney, Agent, or Firm* — Westbridge IP LLC (57) ABSTRACT

A substrate processing method includes loading an operation list of a substrate, the operation list including an operation site bar, an inspection site bar, and an operation flag record enabling bar, the operation site bar including a plurality of operation site flags, and the inspection site bar including an inspection site flag; loading a substrate onto a production line; inquiring an operation site flag corresponding to the operation site at the operation site bar of the operation list, and judging whether the operation site flag is provided with an inspection site flag at the inspection site bar; if the operation site flag is provided with the inspection site flag at the inspection site bar, verifying whether a current operation flag of the substrate matches the inspection site flag; if the
(Continued)

current operation flag of the substrate matches the inspection site flag, processing the substrate at the operation site.

20 Claims, 3 Drawing Sheets (52) U.S. Cl.
CPC ......... *G06Q 30/0185* (2013.01); *G06Q 50/04* (2013.01); *G07C 3/005* (2013.01)

(56) References Cited

U.S. PATENT DOCUMENTS

| | | | |
|---|---|---|---|
| 2006/0079978 A1* | 4/2006 | Chi | G05B 19/41865 700/115 |
| 2006/0106660 A1 | 5/2006 | Varekamp | |
| 2011/0194113 A1* | 8/2011 | Sakai | G01B 11/30 356/432 |
| 2012/0136470 A1* | 5/2012 | Deans | H01L 31/18 700/121 |
| 2015/0338846 A1* | 11/2015 | Boivin | G05B 19/41875 702/84 |
| 2021/0333784 A1* | 10/2021 | Pan | H01L 21/67276 |

FOREIGN PATENT DOCUMENTS

| | | |
|---|---|---|
| CN | 105404243 A | 3/2016 |
| CN | 106324900 A | 1/2017 |
| CN | 107168269 A | 9/2017 |

OTHER PUBLICATIONS

International Search Report and Written Opinion in corresponding PCT Application No. PCT/CN2018/105057, dated Apr. 17, 2019.

* cited by examiner

SUBSTRATE PROCESSING METHOD

CROSS REFERENCE TO RELATED APPLICATIONS

This application is a continuation application of PCT application No. PCT/CN2018/105057, filed on Sep. 11, 2018, which claims the priority of Chinese Patent Application No. 201810784557.7, filed on Jul. 17, 2018, entitled "SUBSTRATE PROCESSING METHOD", the entire content of which is hereby incorporated by reference.

FIELD

The present disclosure relates to the field of panel manufacturing technologies, and in particular, to a substrate processing method.

BACKGROUND

The equipment of a panel factory are divided into a process machine table and a measuring machine table. The process machine table is the table that a glass substrate will certainly run through, and the measuring machine table is the table that the glass substrate is not necessarily required to run through. Taking a thin film transistor (TFT) manufacturing process as an example, the process machine table adopted relates to three main process flows: a thin film process, a lithography process, and an etching process, all of which are needed to be carried out for five cycles, and the sequence of the processes cannot be wrong. In a Manufacturing Execution System (MES), a process flag is used for controlling. Specifically, 15 bits (corresponding to three processes*5 cycles) are used for a Process flag, an initial value of which is 000000000000000, and a corresponding bit is set to be 1 after one main process flow, for example, the process flag is changed to be 100000000000000 after the first thin film process flow. If reworking is carried out, the corresponding bit of the process flag will be set to be 0. Therefore, as for the current method, if the number of cycles of the process is increased, the bit number of the process flag is increased, and in consideration of reworking as well, the control logic of on/off of the process flag is very difficult for coding. Moreover, due to the fact that a hard code manner is adopted, if the process needs to be modified in the future, the program source codes need also to be modified, thus the method is very inconvenient.

SUMMARY

An embodiment of the present disclosure is to provide a substrate processing method, so that the process flag control logic is optimized, and an effective control of process flows of a substrate is achieved.

In order to realize the above objective, the present disclosure provides a substrate processing method including:
loading an operation list of substrate, wherein the operation list includes an operation site bar, an inspection site bar, and an operation flag record enabling bar, the operation site bar includes a plurality of operation site flags, and the inspection site bar includes an inspection site flags;
  loading a substrate onto a production line, a plurality of operation sites are provided on the production line along an advancing direction of the production line, and each operation site is configured for processing the substrate;
  when the substrate flows to an operation site on the production line, inquiring the operation site flag corresponding to the operation site at the operation site bar of the operation list, and judging whether the operation site flag is provided with an inspection site flag at the inspection site bar;
  if the operation site flag is provided with an inspection site flag at the inspection site bar, verifying whether a current operation flag of the substrate matches the inspection site flag;
  if the current operation flag of the substrate matches the inspection site flag, processing the substrate at the operation site;
  where the inspection site is an operation site which the substrate needs to run through prior to the operation site at the operation site bar;
  where the plurality of operation sites include process sites and measurement sites, the plurality of operation site flags include process site flags corresponding to the process sites and measurement site flags corresponding to the measurement sites, and each of the process site flags is configured to be in an enabling state at the operation flag record enabling bar of the operation list, each of the measurement site flags is not provided with an inspection site flag at the inspection site bar of the operation list, and is configured to be in a non-enabling state at the operation flag record enabling bar.

In an embodiment, the substrate processing method includes:
  loading an operation list of substrate, wherein the operation list includes an operation site bar, an inspection site bar and an operation flag record enabling bar, the operation site bar includes a plurality of operation site flags, and the inspection site bar includes inspection site flags;
  loading a substrate onto a production line, a plurality of operation sites are provided on the production line along an advancing direction of the production line, and each operation site is configured for processing the substrate;
  when the substrate flows to an operation site on the production line, inquiring the operation site flag corresponding to the operation site at the operation site bar of the operation list, and judging whether the operation site flag is provided with an inspection site flag at the inspection site bar;
  if the operation site flag is provided with an inspection site flag at the inspection site bar, verifying whether a current operation flag of the substrate matches the inspection site flag;
  if the current operation flag of the substrate matches the inspection site flag, processing the substrate at the operation site.

In an embodiment, the inspection site is an operation site which the substrate needs to run through before the operation site at the operation site bar.

In an embodiment, the plurality of operation sites include process sites and measurement sites, the plurality of operation site flags include process site flags corresponding to the process sites and measurement site flags corresponding to the measurement sites; and each of the process site flags is configured to be in an enabling state at the operation flag record enabling bar of the operation list; each of the measurement site flags is not provided with an inspection site flag at the inspection site bar of the operation list, and is configured to be in a non-enabling state at the operation flag record enabling bar.

In an embodiment, the operation list is a main process flow operation list, each of the process site flags except a first process site flag in the main process flow operation list is provided with an inspection site flag at the inspection site bar of the operation list.

In an embodiment, the operation list is a reworking process flow operation list, each of the process site flags is provided with at least one inspection site flag at the inspection site bar of the operation list.

In an embodiment, the substrate processing method further includes:

if the operation site flag is configured to be in an enabling state at the operation flag record enabling bar, after the substrate is processed at the operation site, recording an operation flag of the substrate to be the operation site flag to update the current operation flag.

In an embodiment, before loading the operation list of substrate, the method further includes:

obtaining an operation list setting interface according to a to-be-performed process flow of the substrate;

selectively setting an inspection site flag at the inspection site bar corresponding to each of the operation site flags at the operation site bar and an enabling state at the enabling bar of each of the operation site flags at the operation site bar in the operation list setting interface to obtain the operation list;

where the operation sites at the operation site bar include process sites and measurement sites, the operation site flags include process site flags corresponding to the process sites and measurement site flags corresponding to the measurement sites, and each of the process site flags is configured to be in an enabling state at the operation flag record enabling bar of the operation list, each of the measurement site flags is not provided with an inspection site flag at the inspection site bar of the operation list, and is configured to be in a non-enabling state at the operation flag record enabling bar.

In an embodiment, at least one of the process site flags is provided with at least one of the inspection site flags at the inspection site bar of the operation list.

In an embodiment, the substrate includes a glass substrate.

In an embodiment, processing the substrate at the operation site is to conduct a thin film process.

In an embodiment, processing the substrate at the operation site is to conduct a lithography process.

In an embodiment, processing the substrate at the operation site is to conduct an etching process.

A substrate processing method includes:

loading an operation list of substrate;

loading a substrate onto a production line, a plurality of operation sites are provided on the production line along an advancing direction of the production line, and each operation site is configured for processing the substrate;

when the substrate flows to an operation site on the production line, inquiring the operation site flag corresponding to the operation site in the operation list, and judging whether the operation site flag is provided with an inspection site flag;

if the operation site flag is provided with an inspection site flag, verifying whether a current operation flag of the substrate matches the inspection site flag;

if the current operation flag of the substrate matches the inspection site flag, processing the substrate at the operation site;

if the current operation flag of the substrate does not match the inspection site flag, skip processing the substrate at the operation site.

In an embodiment, the substrate is provided with an S/N number thereon; and verifying whether a current operation flag of the substrate matches the inspection site flag, includes:

obtaining the S/N number of the substrate using a scanner configured at the operation site;

inquiring an operation flag corresponding to the S/N number in a system database according to the S/N number; and comparing the operation flag with the inspection site flag.

In an embodiment, the operation site is a process site, and the process site flag is configured to be in an enabling state at the operation flag record enabling bar of the operation list.

In an embodiment, the substrate processing method further includes:

after the substrate is processed at the operation site, recording an operation flag of the substrate to be the operation site flag to update the current operation flag.

In an embodiment, the operation list is a main process flow operation list, the operation site bar of the main process flow operation list includes a plurality of operation site flags, the plurality of operation sites include process sites and measurement sites, the operation site flags include process site flags corresponding to the process sites and measurement site flags corresponding to the measurement sites; each of the process site flags except a first process site flag in the main process flow operation list is provided with an inspection site flag.

In an embodiment, the operation list is a reworking process flow operation list, the operation site bar of the reworking process flow operation list includes a plurality of operation site flags, and the plurality of operation sites include process sites and measurement sites, the operation site flags include process site flags corresponding to the process sites and measurement site flags corresponding to the measurement sites; at least one of the process site flags is provided with a plurality of inspection site flags in the reworking process flow operation list.

In an embodiment, the substrate includes a glass substrate; processing the substrate at the operation site is to conduct a thin film process, a lithography process, or an etching process.

According to the embodiment of the present disclosure, the process flag control logic is optimized, and when an operator uses the site jumping function, by controlling a specific operation site, such as a process site, it can effectively prevent the operator from jumping to a wrong site, so that effective control of the process flow of the substrate can be realized.

BRIEF DESCRIPTION OF THE DRAWINGS

To illustrate the technical solutions according to the embodiments of the present disclosure more clearly, the accompanying drawings for describing the embodiments are introduced briefly in the following. Apparently, the accompanying drawings in the following description are only about some embodiments of the present disclosure, and persons of ordinary skill in the art can derive other drawings from the accompanying drawings without creative efforts.

DETAILED DESCRIPTION OF THE EMBODIMENTS

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present disclosure without creative efforts shall fall within the protection scope of the present disclosure.

Figure 1A:
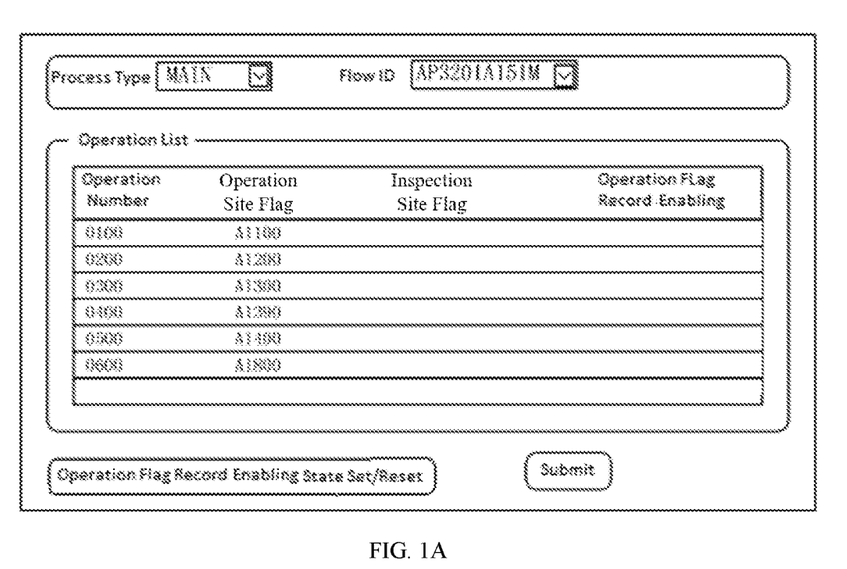
FIG. 1A is a schematic diagram of an initial state of an operation list interface according to an embodiment of the present disclosure.
Figure 1B:
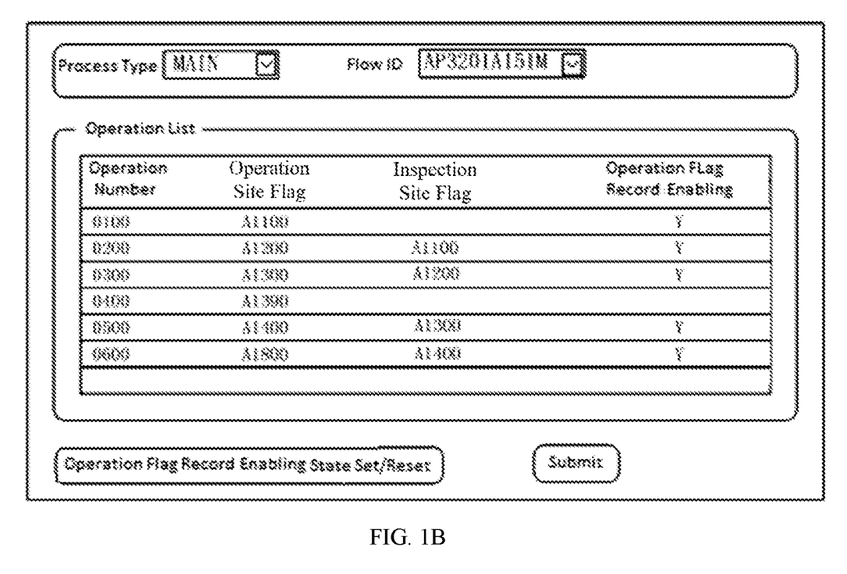
FIG. 1B is a schematic diagram of a target state of the operation list interface shown in FIG. 1A.

The substrate processing method provided by the embodiment of the disclosure adopts a new process flag control logic. Specifically, a system screen and the logic relate to the process flag control logic of the embodiment are shown in FIG. 1A and FIG. 1B, and an operator may obtain an operation list setting interface shown in FIG. 1A according to the process flow to be performed to the substrate, such as process type, flow ID and other information. Then, the operator may select a certain operation site flag corresponding to the certain operation site at the operation site bar in the operation list setting interface shown in FIG. 1A, an inspection site flag which needs to be verified when the substrate enters the operation site is input into the inspection site bar, for example, the inspection site flag at the inspection site bar of the operation site flag A1200 is arranged to be A1100, the inspection site flag at the inspection site bar of the operation site flag A1300 is arranged to be A1200, the inspection site flag at the inspection site bar of the operation site flag A1400 is arranged to be A1300, the inspection site flag at the inspection site bar of the operation site flag A1800 is arranged to be A1400, and the like; the operation site flags A1100, A1200, A1300, A1400 and A1800 are process site flags, i.e. the operation site flags corresponding to the operation sites which a substrate needs to be run through to complete the whole process flow, at a result, in order to avoid the problem caused by the operator using jumping function of the MES system that jumping to a wrong site, except for the first process site flag A1100 in the whole process flow, all the other process site flags are provided with an inspection site flag so as to realize effective management and control of a specific operation site. An inspection site flag is not provided for a measurement site flag, such as A1300.

In addition, the operator may also select a certain operation site flag at operation site bar in the operation list setting interface shown in FIG. 1A, and click the [operation flag record enabling state set/reset] button, so as to set an enabling state(Y) or a non-enabling state (emptying) at the operation flag record enabling bar; each process site, the process site flags such as A1100, A1200, A1300, A1400 and A1800 are all set to be in an enabling state(Y) at the operation flag record enabling bar, and the measurement site flag such as A1300 is set to be in a non-enabling state (emptying) at the operation flag record enabling bar. After the inspection site bar and the operation flag record enabling bar of each operation site are set completely, and a [submit] button is clicked, a target operation list interface as shown in FIG. 1B can be obtained, so as to be loaded and used in the subsequent substrate processing.

Figure 1C:
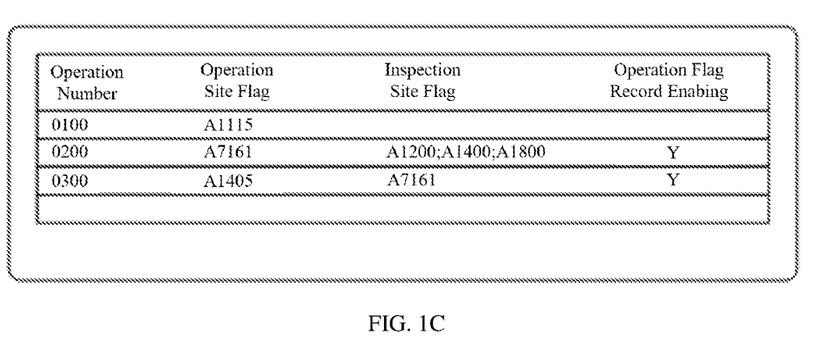
FIG. 1C is a schematic diagram of another operation list according to an embodiment of the present disclosure.

It is noted that the main process flow operation list is shown in FIG. 1B, however, the process flow types involved in the embodiments of the disclosure are not limited to the main process flow (MAIN), they can also be applied to other process flow such as reworking process flow(Rework), and the specific reworking process flow operation list is shown in FIG. 1C. In the reworking process flow operation list shown in FIG. 1C, A7161 and A1405 are process site flags, and A1115 is a measurement site flag; and some process site flags such as A7161 may be provided with a plurality of inspection site flags, the measuring site flag is still not provided with an inspection site flag and the operation flag record enabling bar of the measuring site is set to be in a non-enabling state.

Figure 2:
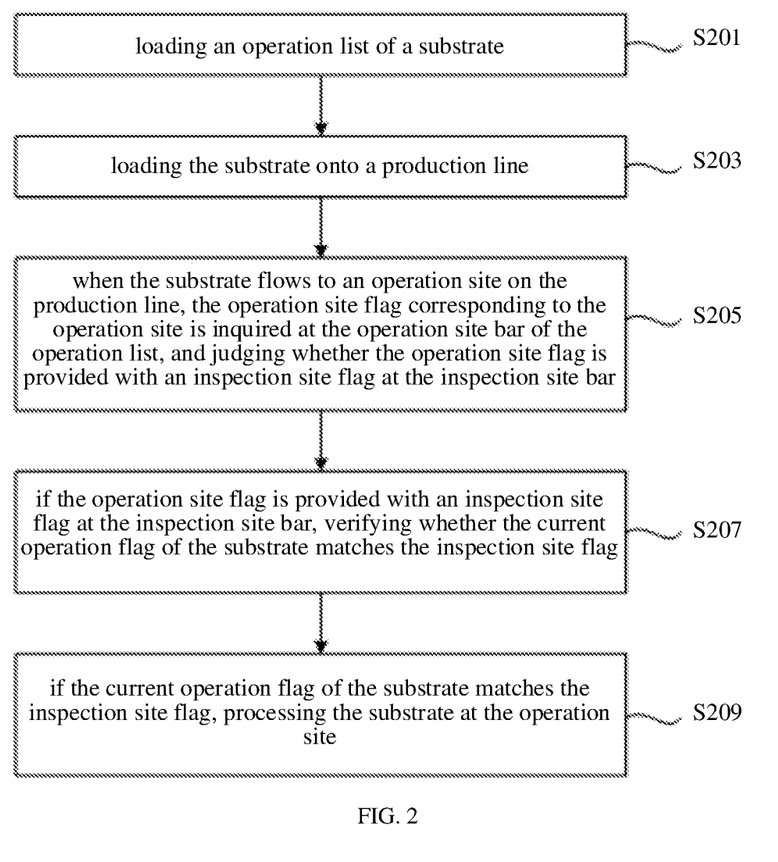
FIG. 2 is a flowchart of a substrate processing method according to an embodiment of the present disclosure.
Figure 3:
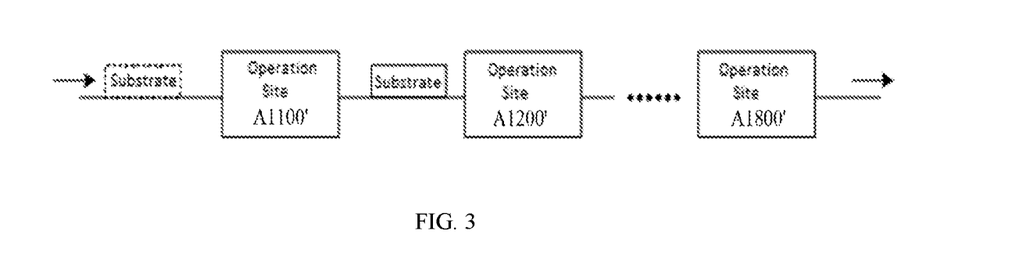
FIG. 3 is a schematic structural diagram of a production line according to an embodiment of the present disclosure.

Referring to FIG. 2 and FIG. 3, the substrate processing method according to the embodiment includes, for example, the following steps S201, S203, S205, S207 and S209, specifically:

S201: loading an operation list of a substrate;

S203: loading a substrate onto a production line;

S205: when the substrate flows to an operation site on the production line, the operation site flag corresponding to the operation site is inquired at the operation site bar of the operation list, and judging whether the operation site flag is provided with an inspection site flag;

S207: if the operation site flag is provided with an inspection site flag at the inspection site bar, verifying whether a current operation flag of the substrate matches the inspection site flag;

S209: if the current operation flag of the substrate matches the inspection site flag, processing the substrate at the operation site.

In details, the operation list loaded in S201 is, for example, a main process flow (MAIN) operation list loaded by a MES system, and the operation list includes an operation sequence number bar, an operation site bar, an inspection site bar and an operation flag record enabling bar, in order to increase user-friendliness and the expandability of the interface, other bars could be further included. More specifically, in FIG. 1B, the operation sequence number bar includes the operation sequence number, such as 0100, 0200, 0300, 0400, 0500, 0600 and the like; it means the whole process flow is designed to have six operation sites; the operation site bar includes six identification number of the operation sites, namely the operation site flags corresponding to each of the operation sites, such as A1100, A1200, A1300, A1390, A1400, A1800 and the like, wherein A1100, A1200, A1300, A1400 and A1800 are process site flags, which correspond to the process sites, such as a film process site, a lithography process site or an etching process site and the like, and they are the operation sites which the substrate is required to run through to complete the whole process flow, and A1390 is a measurement site flag correspond to an operation site that is not necessary for the substrate to run through; the inspection site bar includes inspection site flags, such as A1100, A1200, A1300, A1400 and the like, the operation site flag A1200 is taken as an example, and A1100 is set to be the inspection site flag, before the operation site corresponding to the operation site flag A1200 carries out the process, firstly, whether the substrate has been subjected to the process performed by the operation site corresponding to the inspection site flag A1100 is verified; the operation flag record enabling bar includes an enabling state (Y) and a non-enabling state (emptying), referring to FIG. 1B, the process site flag is set to be in an enabling state (Y) at the operation flag record enabling bar, and the measuring site flag is set to be in a non-enabling state (emptying) at the operation flag record enabling bar.

In S203, the substrate is loaded onto a production line, such as shown in FIG. 3, a plurality of operation sites are arranged on the whole production line, for example, along the advancing direction (or the flow direction) of the substrate, such as A1100', A1200', . . . , A1800'. Each operation site is used for processing the substrate, the processing of display panel, such as a glass substrate for a liquid crystal display panel, is taken as an example, the substrate which is originally loaded on the production line is a glass substrate. While the glass substrate sequentially goes through various operation sites, a plurality of film layers are formed on the glass substrate, for example, a first metal layer including a grid electrode, a scanning line and a common electrode wiring; a gate insulating layer, a semiconductor layer, an ohmic contact layer; a second metal layer including a source drain electrode and a data line, a passivation layer formed with contact holes, a transparent pixel electrode layer and the like, where the film layers are stacked in an order mentioned above, and finally, a thin film transistor (TFT) array substrate can be obtained.

As described above, in S205, when the substrate flows into a certain operation site on the production line, such as the operation site A1200' after the operation site A1100' corresponding to the operation site flag A1100 shown in FIG. 3, the MES system inquires the operation site flag A1200 corresponding to the operation site A1200' at the operation site bar of the operation list loaded in S201, and judges whether the inquired operation site flag A1200 is provided with an inspection site flag at the inspection site bar.

In S207, continues to take the operation site flag A1200 as an example, the operation site flag A1200 is provided with an inspection site flag A1100 at the inspection site bar; the system will continue to verify whether the current operation flag of the substrate matches the inspection site flag A1100. Wherein the current operation flag of the substrate is obtained by: obtaining a S/N number set on the substrate by a scanner provided on the operation site A1200', and then inquiring an operation flag corresponding to the S/N number in the system database according to the S/N number. The operation flag herein is typically represented by operation site flags (e.g., an operation site identification number). If the S207 verifies that the current operation flag of the substrate matches the inspection site flag A1100, it indicates that the verification is successful, then executing S209; otherwise, if not matching, it indicates that the verification fails, and a message is returned to indicate causes of the failure, the operation site A1200' will not process the substrate later, in other words, the operation site A1200' will not allow the substrate to enter.

In S209, if the current operation flag of the substrate matches the inspection site flag A1100, which indicates that the substrate has gone through operation site A1100', that is, the verification is successful, so that the substrate is processed by the process equipment of the operation site A1200'. The glass substrate for the display panel is taken as an example, the processing is, for example, a thin film process, a lithography process or an etching process.

In addition, the substrate processing method of the embodiment may further include the following steps: if the operation site flag is set to be in an enabling state at the operation flag record enabling bar, after the substrate is processed at the operation site corresponding to the operation site flag completely, the operation flag of the substrate is recorded to be the operation site flag, to update the current operation flag of the substrate. Taking the operation site flag A1100 corresponding to the operation site A1100' as an example, it is set to be in an enabling state (Y) at the operation flag record enabling bar, after the substrate is processed at the operation site A1100' completely, a MES system records the operation flag of the substrate (represented by the S/N number) to be operation site flag A1100, so that a verification of sites may be carried out subsequently.

Further, the substrate processing method according to the embodiment may further include the following steps before 201: obtaining an operation list setting interface (such as shown in FIG. 1A) according to the process flow to be performed to the substrate); selectively arranging the inspection site flag at the inspection site bar and the enabling state at the enabling bar of each operation site flag at the operation site bar in the operation list setting interface, so as to obtain the operation list (such as shown in FIG. 1B). Specific details of this step may be referred to the related description of FIGS. 1A and 1B, and will not be described in detail herein.

In several embodiments provided by the present disclosure, it should be understood that, the system, device and/or method disclosed herein can be realized in other manners. For example, embodiments of the device described above are merely illustrative, for example, the division of the unit is merely a logic function division, and in actual practice, additional division manners can be adopted, for example, a plurality of units or components may be combined or may be integrated into another system, or some features may be ignored or not executed. Another aspect, the displayed or discussed mutual coupling or direct coupling or communication connection can be through some interfaces, an indirect coupling or communication connection of devices or units can be in an electrical, mechanical or other manners.

The units illustrated as separate components may or may not be physically separated, the components displayed as units may or may not be physical units, which may be located in one place, or may be distributed on multiple network units. According to actual requirements, some or all of the units may be selected to achieve the aims of the scheme of the embodiment.

The above mentioned embodiments are only used to illustrate the technical solutions of the present disclosure without limitation thereto; although the disclosure is described in detail with reference to the embodiments described above, it should be understood by ordinary person skilled in the art; the technical solution described in the embodiments can still be modified, or some of the technical features thereof can be equivalently replaced; these modifications or replacements do not make the essence of the corresponding technical solution depart from the spirit and scope of the technical solutions of the embodiments of the present disclosure.

What is claimed is:

1. A substrate processing method, comprising:
    loading, by a manufacturing execution system (MES), an operation list of a substrate, wherein the operation list comprises an operation site bar, an inspection site bar, and an operation flag record enabling bar, the operation site bar comprises a plurality of operation site flags, and the inspection site bar comprises an inspection site flag;
    loading the substrate onto a production line, wherein a plurality of operation sites are provided on the production line along an advancing direction of the production line, and each operation site is configured for processing the substrate;

when the substrate flows to an operation site on the production line, inquiring, by the MES, an operation site flag corresponding to the operation site at the operation site bar of the operation list, and judging, by the MES, whether the operation site flag is provided with the inspection site flag at the inspection site bar;

if the operation site flag is provided with the inspection site flag at the inspection site bar, verifying, by the MES, whether a current operation flag of the substrate matches the inspection site flag;

if the current operation flag of the substrate matches the inspection site flag, processing the substrate at the operation site;

wherein the inspection site is a different operation site which the substrate needs to run through prior to the operation site corresponding to the operation site flag at the operation site bar;

wherein the plurality of operation sites comprise process sites and measurement sites, the plurality of operation site flags comprise process site flags corresponding to the process sites and measurement site flags corresponding to the measurement sites, and each of the process site flags is configured to be in an enabling state at the operation flag record enabling bar of the operation list, each of the measurement site flags is not provided with the inspection site flag at the inspection site bar of the operation list, and is configured to be in a non-enabling state at the operation flag record enabling bar.

2. A substrate processing method, comprising:

loading, by a manufacturing execution system (MES), an operation list of a substrate, wherein the operation list comprises an operation site bar, an inspection site bar and an operation flag record enabling bar, the operation site bar comprises a plurality of operation site flags, and the inspection site bar comprises inspection site flags;

loading the substrate onto a production line, wherein a plurality of operation sites are provided on the production line along an advancing direction of the production line, and each operation site is configured for processing the substrate;

when the substrate flows to an operation site on the production line, inquiring, by the MES, an operation site flag corresponding to the operation site at the operation site bar of the operation list, and judging, by the MES, whether the operation site flag is provided with an inspection site flag at the inspection site bar;

if the operation site flag is provided with the inspection site flag at the inspection site bar, verifying, by the MES, whether a current operation flag of the substrate matches the inspection site flag;

if the current operation flag of the substrate matches the inspection site flag, processing the substrate at the operation site.

3. The substrate processing method according to claim 2, wherein an inspection site is a different operation site which the substrate needs to run through prior to the operation site corresponding to the operation site flag at the operation site bar.

4. The substrate processing method according to claim 2, wherein the plurality of operation sites comprise process sites and measurement sites, the plurality of operation site flags comprise process site flags corresponding to the process sites and measurement site flags corresponding to the measurement sites; and each of the process site flags is configured to be in an enabling state at the operation flag record enabling bar of the operation list; each of the measurement site flags is not provided with the inspection site flag at the inspection site bar of the operation list, and is configured to be in a non-enabling state at the operation flag record enabling bar.

5. The substrate processing method according to claim 4, wherein the operation list is a main process flow operation list, wherein each of the process site flags except a first process site flag in the main process flow operation list is provided with the inspection site flag at the inspection site bar of the operation list.

6. The substrate processing method according to claim 4, wherein the operation list is a reworking process flow operation list, wherein each of the process site flags is provided with at least one inspection site flag at the inspection site bar of the operation list.

7. The substrate processing method according to claim 2, further comprising:

if the operation site flag is configured to be in an enabling state at the operation flag record enabling bar, after the substrate is processed at the operation site, recording an operation flag of the substrate to be the operation site flag corresponding to the operation site, to update the current operation flag.

8. The substrate processing method according to claim 2, further comprising, before loading the operation list of the substrate:

obtaining an operation list setting interface according to a to-be-performed process flow of the substrate;

selectively setting the inspection site flag at the inspection site bar corresponding to each of the plurality of operation site flags at the operation site bar and an enabling state at the operation flag record enabling bar of each of the plurality of operation site flags at the operation site bar in the operation list setting interface, to obtain the operation list;

wherein the plurality of operation site flags at the operation site bar comprise process site flags and measurement site flags, and each of the process site flags is configured to be in the enabling state at the operation flag record enabling bar of the operation list, each of the measurement site flags is not provided with the inspection site flag at the inspection site bar of the operation list, and is configured to be in a non-enabling state at the operation flag record enabling bar.

9. The substrate processing method according to claim 8, wherein at least one of the process site flags is provided with at least one of the inspection site flags at the inspection site bar of the operation list.

10. The substrate processing method according to claim 2, wherein the substrate comprises a glass substrate.

11. The substrate processing method according to claim 2, wherein processing the substrate at the operation site is to conduct a thin film process.

12. The substrate processing method according to claim 2, wherein processing the substrate at the operation site is to conduct a lithography process.

13. The substrate processing method according to claim 2, wherein processing the substrate at the operation site is to conduct an etching process.

14. A substrate processing method, comprising:

loading, by a manufacturing execution system (MES), an operation list of a substrate;

loading the substrate onto a production line, wherein a plurality of operation sites are provided on the production line along an advancing direction of the production line, and each operation site is configured for processing the substrate;

when the substrate flows to an operation site on the production line, inquiring, by the MES, an operation site flag corresponding to the operation site in the operation list, and judging, by the MES, whether the operation site flag is provided with an inspection site flag;

if the operation site flag is provided with the inspection site flag, verifying, by the MES, whether a current operation flag of the substrate matches the inspection site flag;

if the current operation flag of the substrate matches the inspection site flag, processing the substrate at the operation site;

if the current operation flag of the substrate does not match the inspection site flag, skip processing the substrate at the operation site.

15. The substrate processing method according to claim 14, wherein the substrate is provided with an S/N number thereon; and wherein verifying whether the current operation flag of the substrate matches the inspection site flag comprises:

obtaining the S/N number of the substrate using a scanner configured at the operation site;

inquiring an operation flag corresponding to the S/N number in a system database according to the S/N number; and comparing the operation flag with the inspection site flag.

16. The substrate processing method according to claim 14, wherein the operation site is a process site, and a process site flag corresponding to the process site is configured to be in an enabling state at the operation flag record enabling bar of the operation list.

17. The substrate processing method according to claim 16, further comprising:

after the substrate is processed at the operation site, recording an operation flag of the substrate to be the operation site flag corresponding to the operation site, to update the current operation flag.

18. The substrate processing method according to claim 14, wherein the operation list is a main process flow operation list, the operation site bar of the main process flow operation list comprises a plurality of operation site flags, the plurality of operation sites comprise process sites and measurement sites, the plurality of operation site flags comprise process site flags corresponding to the process sites and measurement site flags corresponding to the measurement sites; each of the process site flags except a first process site flag in the main process flow operation list is provided with the inspection site flag.

19. The substrate processing method according to claim 14, wherein the operation list is a reworking process flow operation list, the operation site bar of the reworking process flow operation list comprises a plurality of operation site flags, and the plurality of operation sites comprise process sites and measurement sites, the plurality of operation site flags comprise process site flags corresponding to the process sites and measurement site flags corresponding to the measurement sites; at least one of the process site flags is provided with a plurality of inspection site flags in the reworking process flow operation list.

20. The substrate processing method according to claim 14, wherein the substrate comprises a glass substrate; wherein processing the substrate at the operation site is to conduct a thin film process, a lithography process, or an etching process.

* * * * *